(12) United States Patent
Bae et al.

(10) Patent No.: US 6,373,754 B1
(45) Date of Patent: Apr. 16, 2002

(54) SEMICONDUCTOR MEMORY DEVICE HAVING STABLE INTERNAL SUPPLY VOLTAGE DRIVER

(75) Inventors: Yong-cheol Bae, Seoul; Gi-hong Kim, Goynag, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/617,208

(22) Filed: Jul. 17, 2000

(51) Int. Cl.[7] .................................................. G11C 7/00
(52) U.S. Cl. .............................. 365/189.09; 365/189.11; 365/226; 327/540
(58) Field of Search ........................... 365/189.09, 226, 365/189.11, 230.06, 189.07, 230.03; 327/540, 535–538, 541; 323/314, 313, 315, 316

(56) References Cited

U.S. PATENT DOCUMENTS 5,689,460 A * 11/1997 Ooishi ................... 365/189.07
5,982,162 A * 11/1999 Yamauchi ................. 323/316
6,046,624 A * 4/2000 Nam et al. ................ 327/530
6,163,180 A * 12/2000 Hidaka et al. ............. 327/112

* cited by examiner

Primary Examiner—David Nelms
Assistant Examiner—Gene N. Auduong
(74) Attorney, Agent, or Firm—Marger Johnson & McCollom, P.C.

(57) ABSTRACT

A semiconductor memory device, in which the output of an internal supply voltage is stable, is provided. The semiconductor memory device includes a memory cell array block, a differential amplifier, using a reference voltage and an internal supply voltage fed back from the memory cell array block as inputs, an internal supply voltage driver for supplying an internal supply voltage to the memory cell array block in response to the output of the differential amplifier, a pull down circuit for pulling down the output port of the differential amplifier in response to a control signal having a predetermined pulse, and a control signal generating circuit for generating the control signal.

11 Claims, 5 Drawing Sheets

SEMICONDUCTOR MEMORY DEVICE HAVING STABLE INTERNAL SUPPLY VOLTAGE DRIVER

BACKGROUND OF THE INVENTION

1. Field of the Invention

The present invention relates to a semiconductor memory device, and more particularly, to a semiconductor memory device having a stable internal supply voltage driver.

2. Description of the Related Art

As the integration density of semiconductor memory devices increases, the structure of supply voltage generating means of a memory cell array is very important. Namely, various problems are caused since a plurality of memory cell arrays simultaneously operate. In particular, when the memory cell array operates, a supply voltage generating apparatus for supplying power to the memory cell array must simultaneously supply a large amount of charge. Accordingly, noise can be generated in the power supply. Therefore, in general, in order to make up for a deficiency in charge, the supply voltage generating apparatus is operated by feeding back a supply voltage to the supply voltage generating apparatus. However, in this case, since chips become large, operation speed is reduced.

FIG. 1. is a schematic block diagram of a semiconductor memory device having a conventional internal supply voltage driving scheme.

Referring to FIG. 1, the conventional semiconductor device includes a memory cell array block 101, a differential amplifier 103 using an internal supply voltage MIVC, which are fed back from the memory cell array block 101, and a reference voltage VREF, and an internal supply voltage driver 105 for driving an internal supply voltage IVC in response to the output of the differential amplifier 103. The internal supply voltage IVC is generated by an internal supply voltage generating apparatus, which is not shown.

However, in the semiconductor memory device having the conventional internal supply voltage driving scheme, when the size of the memory cell array block 101 is large, that is, when the number of bit line pairs BL and $\overline{BL}$ to be sensed at one time is large, a large amount of current is consumed by the memory array block 101 during a sensing operation. Accordingly, a severe dip 201 phenomenon occurs in the output N1 of the internal supply voltage driver 105, as shown in FIG. 2. The dip phenomenon produces a bad effect on parameters related to the speed of the semiconductor memory device. Also, the semiconductor memory device may mis-operate due to the noise caused by the dip phenomenon.

Therefore, in the conventional semiconductor memory device, the differential amplifier 103 is driven by the internal supply voltage MIVC fed back from the memory cell array block 101 and the internal supply voltage driver 105 is driven by the output of the differential amplifier 103, so that the dip phenomenon is reduced. However, in this case, it is difficult to sufficiently prevent the dip 201 phenomenon since it takes time to feed back the internal supply voltage MIVC. Also, an overshooting 202 phenomenon may occur in the output N1 of the internal supply voltage driver 105, as shown in FIG. 2, after the internal supply voltage driver 105 is driven, due to a delay time until the internal supply voltage MIVC is fed back.

SUMMARY OF THE INVENTION

In order to solve the above problems, it is an object of the present invention to provide a semiconductor memory device, in which the output of an internal supply voltage driver is stable.

To achieve the above object, according to an aspect of the present invention, there is provided a semiconductor memory device, comprising a memory cell array block, a differential amplifier, using a reference voltage and an internal supply voltage fed back from the memory cell array block as inputs, an internal supply voltage driver for supplying an internal supply voltage to the memory cell array block in response to the output of the differential amplifier, a pull down circuit for pulling down the output port of the differential amplifier in response to a control signal having a predetermined pulse, and a control signal generating circuit for generating the control signal in response to an input signal transited during a sensing operation of the memory cell array block.

The control signal generating circuit is a pulse generating circuit for generating the control signal having a positive pulse in response to the input signal.

According to another aspect of the present invention, there is provided a semiconductor memory device, comprising a memory cell array block, a differential amplifier, using a reference voltage and an internal supply voltage fed back from the memory cell array block as inputs, an internal supply voltage driver for supplying an internal supply voltage to the memory cell array block in response to the output of the differential amplifier, a pull up circuit for pulling up the output port of the differential amplifier in response to a control signal having a predetermined pulse, a delay circuit for delaying an input signal transited during the sensing operation of the memory cell array block for a predetermined time and outputting the delayed input signal, and a control signal generating circuit for generating the control signal in response to the output signal of the delay circuit.

The control signal generating circuit is a pulse generating circuit for generating the control signal having a negative pulse in response to the input signal.

BRIEF DESCRIPTION OF THE DRAWING(S)

The above object and advantages of the present invention will become more apparent by describing in detail a preferred embodiment thereof with reference to the attached drawings in which.

DESCRIPTION OF THE PREFERRED EMBODIMENT

Figure 1:
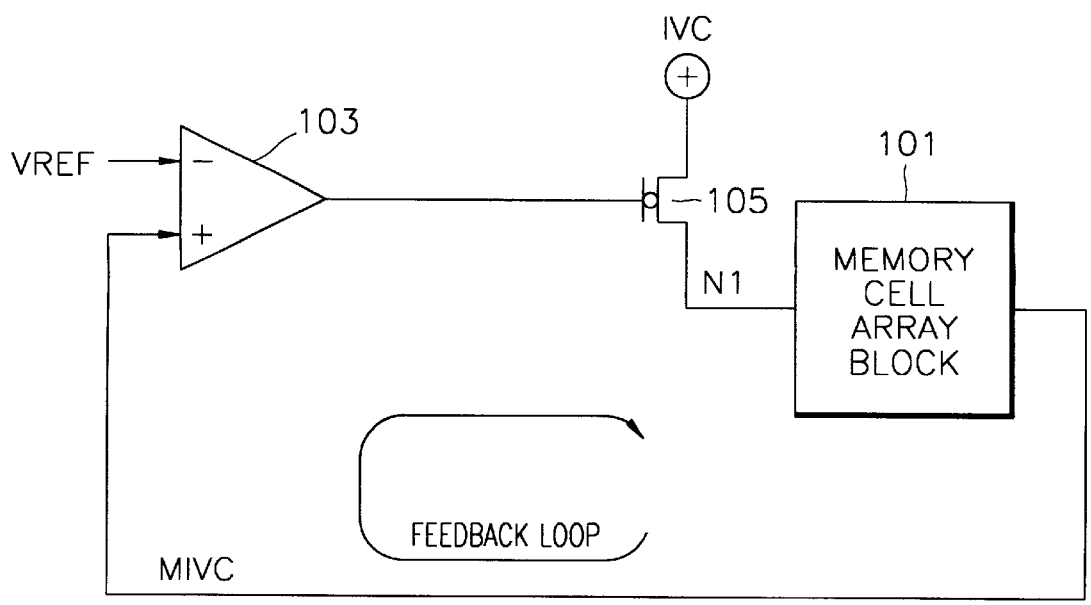
FIG. 1 is s schematic block diagram showing a semiconductor memory device having a conventional internal supply voltage driving scheme.
Figure 2:
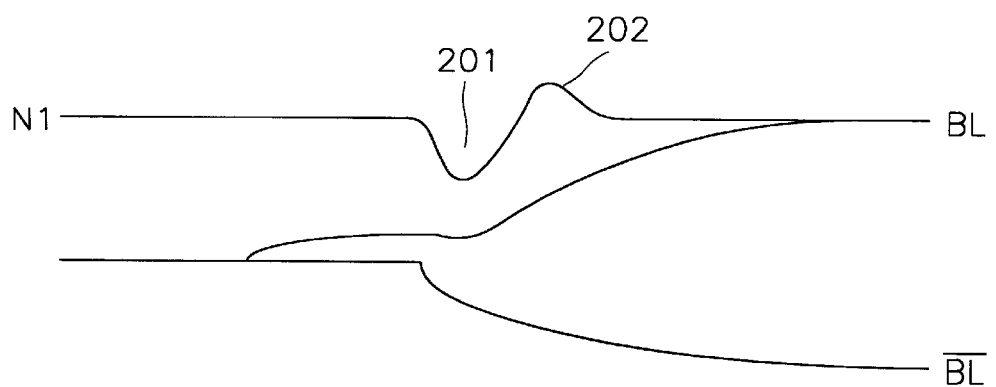
FIG. 2 shows a dip phenomenon and an overshooting phenomenon in the output of an internal supply voltage driver in the conventional semiconductor memory device shown in FIG. 1.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art the same reference numerals in different drawings represent the same element, and thus their description will be omitted.

Figure 3:
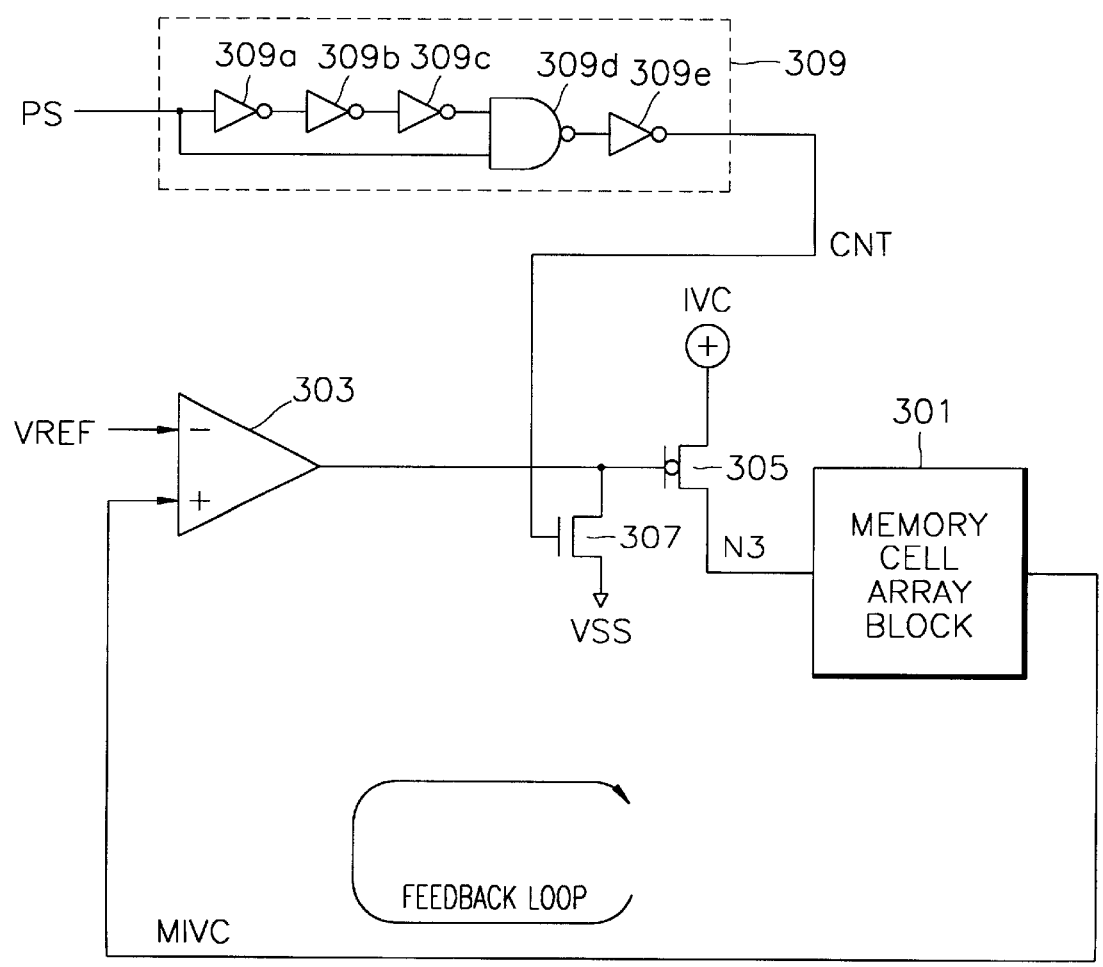
FIG. 3 is a schematic circuit diagram showing a semiconductor memory device according to a first embodiment of the present invention.

Referring to FIG. 3, a semiconductor memory device according to a first embodiment of the present invention includes a memory cell array block 301, a differential amplifier 303 using a reference voltage VREF and an internal supply voltage MIVC fed back from the memory cell array block 301 as inputs, an internal supply voltage driver 305 for supplying an internal supply voltage IVC to the memory cell array block 301 in response to the output of the differential amplifier 303, pull down means 307 for pulling down the output port of the differential amplifier 303 in response to a control signal CNT, and control signal generating means 309 for generating the control signal CNT in response to an input signal PS.

The internal supply voltage IVC is generated by an internal supply voltage generating apparatus, which is not shown. The input signal PS is transited from a logic $^2$low$^2$ level to a logic $^2$high$^2$ level at the point of time where the internal supply voltage is used by the memory cell array block 301 during a sensing operation.

The internal supply voltage driver 305 is constituted of a PMOS transistor, in which the internal supply voltage IVC is connected to a source, the output of the differential amplifier 303 is connected to a gate, and an output node N3, which is a drain, is connected to the memory cell array block 301.

The pull down means 307 is constituted of an NMOS transistor, in which the output of the differential amplifier 303 is connected to a drain, the control signal CNT is connected to a gate, and a ground voltage VSS is connected to a source.

The control signal generating means 309, which is an automatic pulse generator, includes a first inverter 309a for receiving the input signal PS and inverting the received input signal PS, a second inverter 309b for inverting the output of the first inverter, a third inverter 309c for inverting the output of the second inverter, a NAND gate 309d using the output of the third inverter and the input signal PS as inputs, and a fourth inverter 309e for inverting the output of the NAND gate and generating the control signal CNT. Here, the first through third inverters 309a through 309c are delay elements and an inversion delay circuit is constituted of the odd-numbered inverters.

To be more specific, the input signal PS is transited from the logic $^2$low$^2$ level to the logic $^2$high$^2$ level at the point of time where the internal supply voltage is used by the memory cell array block 301 during the sensing operation. Accordingly, the control signal CNT having a predetermined positive pulse is generated by the control signal generating means 309. Accordingly, the pull down means 307 is turned on for a time corresponding to the width of the positive pulse and the output of the differential amplifier 303 is pulled down for a predetermined time. Therefore, the internal supply voltage driver 305 is turned on for the predetermined time at the point of time where the internal supply voltage is used during the sensing operation. Accordingly, charges are intensively supplied to the output node N3.

Figure 7:
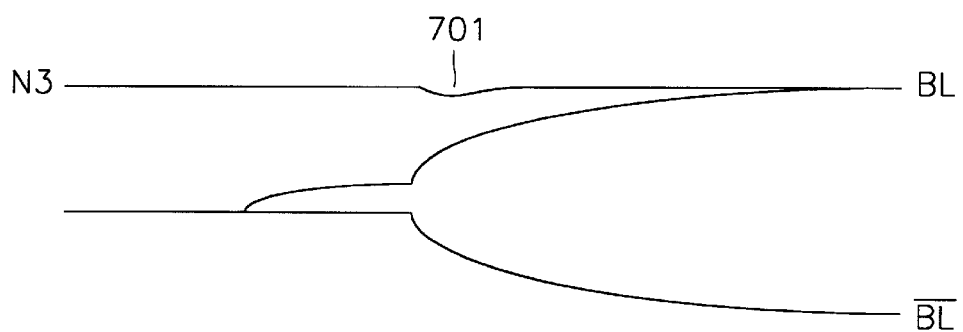
FIG. 7 shows that the dip phenomenon and the overshooting phenomenon are reduced in the semiconductor memory device according to the present invention, which are shown in FIGS. 3 through 6.

Therefore, the output N3 of the internal supply voltage driver 305 has a stable value. Namely, as shown in FIG. 7, a dip 701 phenomenon is reduced and an overshooting phenomenon is removed.

Figure 4:
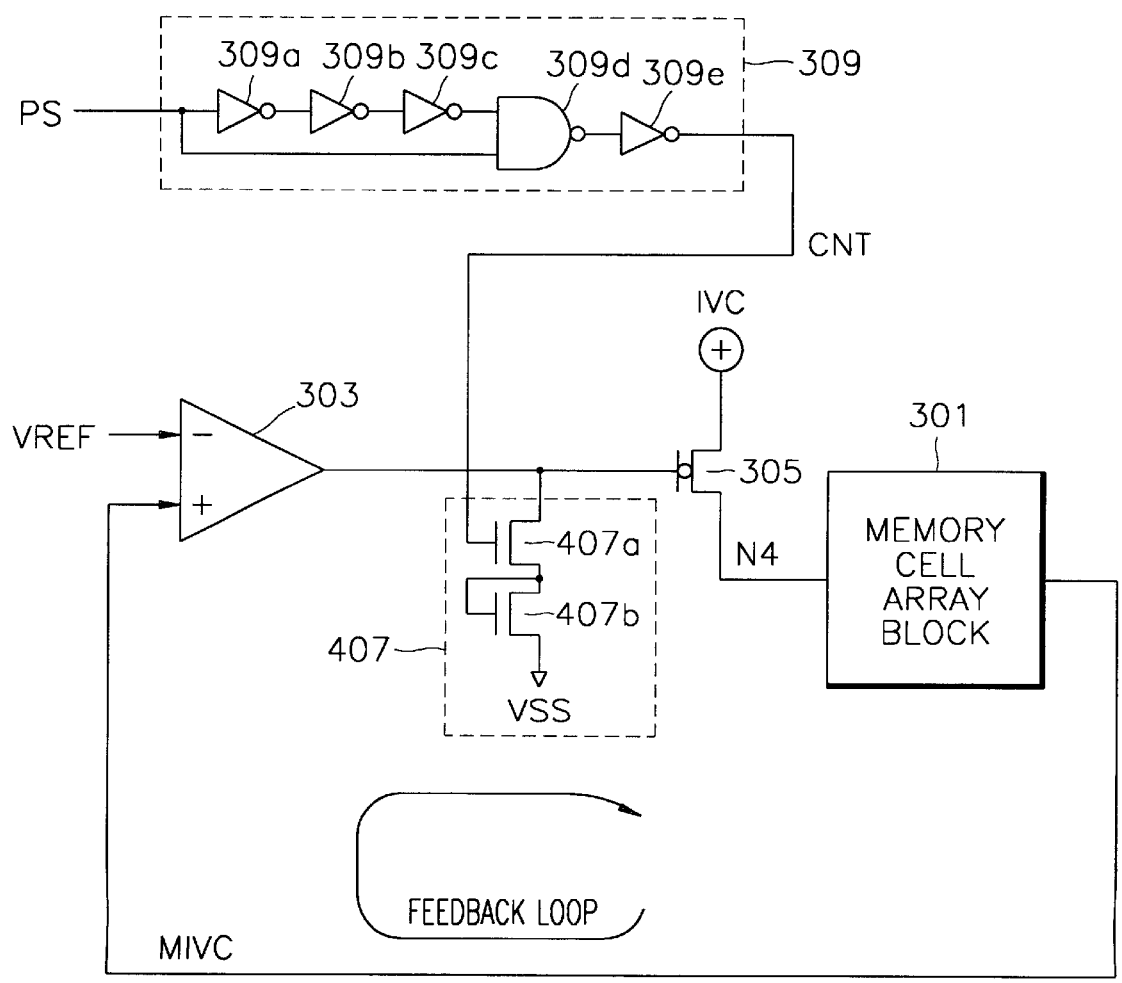
FIG. 4 is a schematic circuit diagram showing a semiconductor memory device according to a second embodiment of the present invention.

FIG. 4 is a schematic circuit diagram of a semiconductor memory device according to a second embodiment of the present invention.

Referring to FIG. 4, the structure of the semiconductor memory device according to the second embodiment of the present invention is the same as the structure of the semiconductor memory device according to the first embodiment of the present invention, which is shown in FIG. 3, excluding that the structure of pull down means 407 is different from the structure of the pull down means 307.

The pull down means 407 includes a first NMOS transistor 407a, in which the output of the differential amplifier 303 is connected to a drain and the control signal CNT is connected to a gate, and a second NMOS transistor 407b, in which the source of the first NMOS transistor 407a is connected to a drain and a gate and the ground voltage VSS is connected to a source. The second NMOS transistor 407b operates as a diode.

The second NMOS transistor 407b is for reducing the change in the output of the differential amplifier 303, that is, the gate voltage of the internal supply voltage driver 305 when the first NMOS transistor 407a is turned on for a time corresponding to the width of the positive pulse of the control signal CNT. Namely, the second NMOS transistor 407b is for preventing the gate voltage of the internal supply voltage driver 305 from being reduced to less than the threshold voltage of the second NMOS transistor 407b.

Therefore, in the semiconductor memory device according to the second embodiment shown in FIG. 4, the reaction speed of the internal supply voltage driver 305 is increased than in the semiconductor memory device according to the first embodiment, which is shown in FIG. 3.

Figure 5:
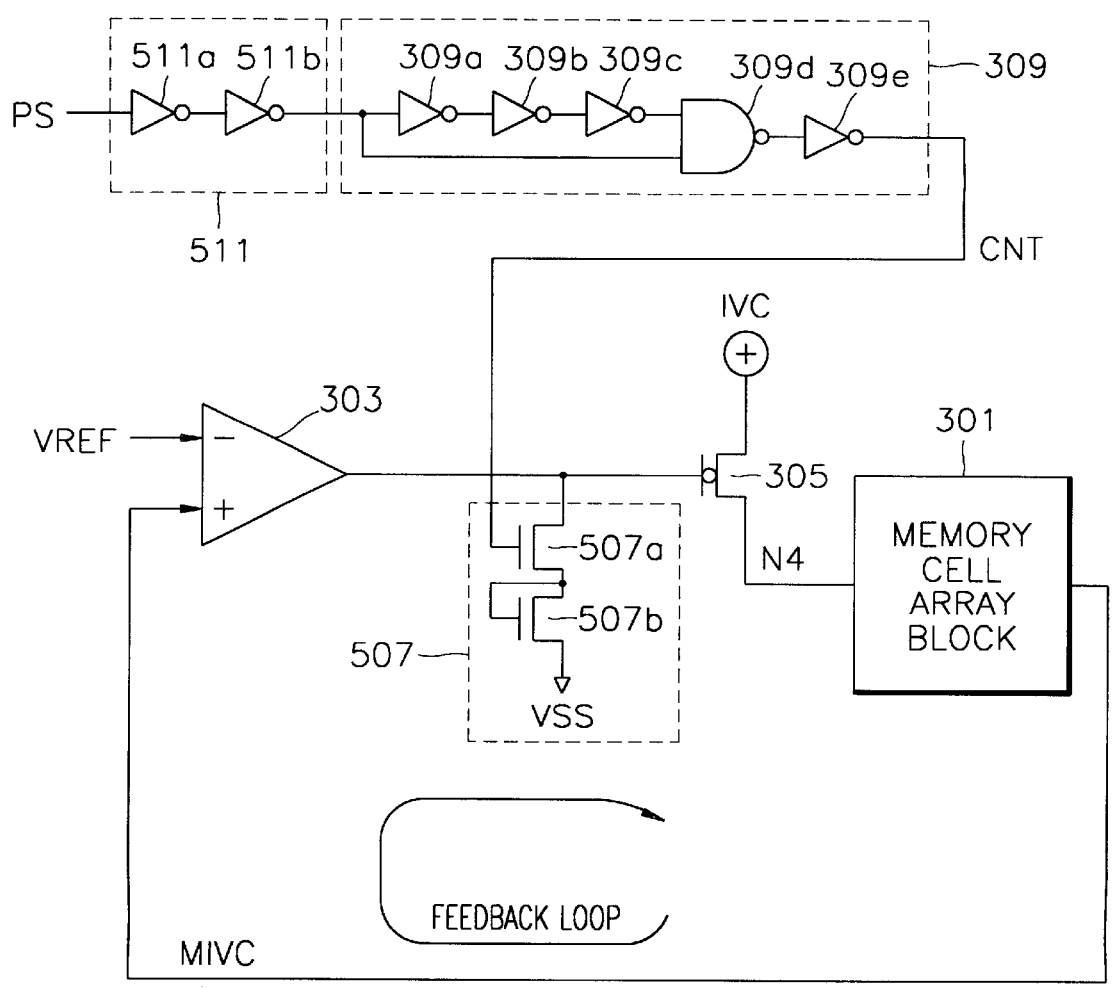
FIG. 5 is a schematic circuit diagram showing a semiconductor memory device according to a third embodiment of the present invention.

FIG. 5 is a schematic circuit diagram of a semiconductor memory device according to a third embodiment of the present invention.

Referring to FIG. 5, the semiconductor memory device according to the third embodiment of the present invention further includes delay means 511, compared with the semiconductor memory device according to the second embodiment, which is shown in FIG. 4. Also, the structure of pull down means 507 is different from the structure of the pull down means 407.

The pull down means 507 includes an NMOS transistor 507a, in which the output of the differential amplifier 303 is connected to a drain and the control signal CNT is connected to a gate, and a resistor 507b, in which one end is connected to the source of the first NMOS transistor 507a and the other end is connected to the ground voltage VSS.

The resistor 507b is for reducing speed at which the output of the differential amplifier 303, that is, the gate voltage of the internal supply voltage driver 305 is pulled down when the NMOS transistor 507a is turned on for a time corresponding to the width of the positive pulse of the control signal CNT.

The delay means 511, for controlling the point of time at which the positive pulse of the control signal CNT generated by the control signal generating means 309 is enabled, delays the input signal PS for a predetermined time and outputs the delayed input signal PS to the control signal generating means 309. The delay means 511 includes a first inverter 511a for receiving the input signal PS and inverting the received input signal PS and a second inverter 511b for inverting the output of the first inverter. Here, the first and second inverters 511a and 511b are delay elements.

Therefore, in the semiconductor memory device according to the third embodiment shown in FIG. 5, the degree at which the internal supply voltage is supplied to the memory cell array block 301 can be controlled by the size of the resistor 507b.

Figure 6:
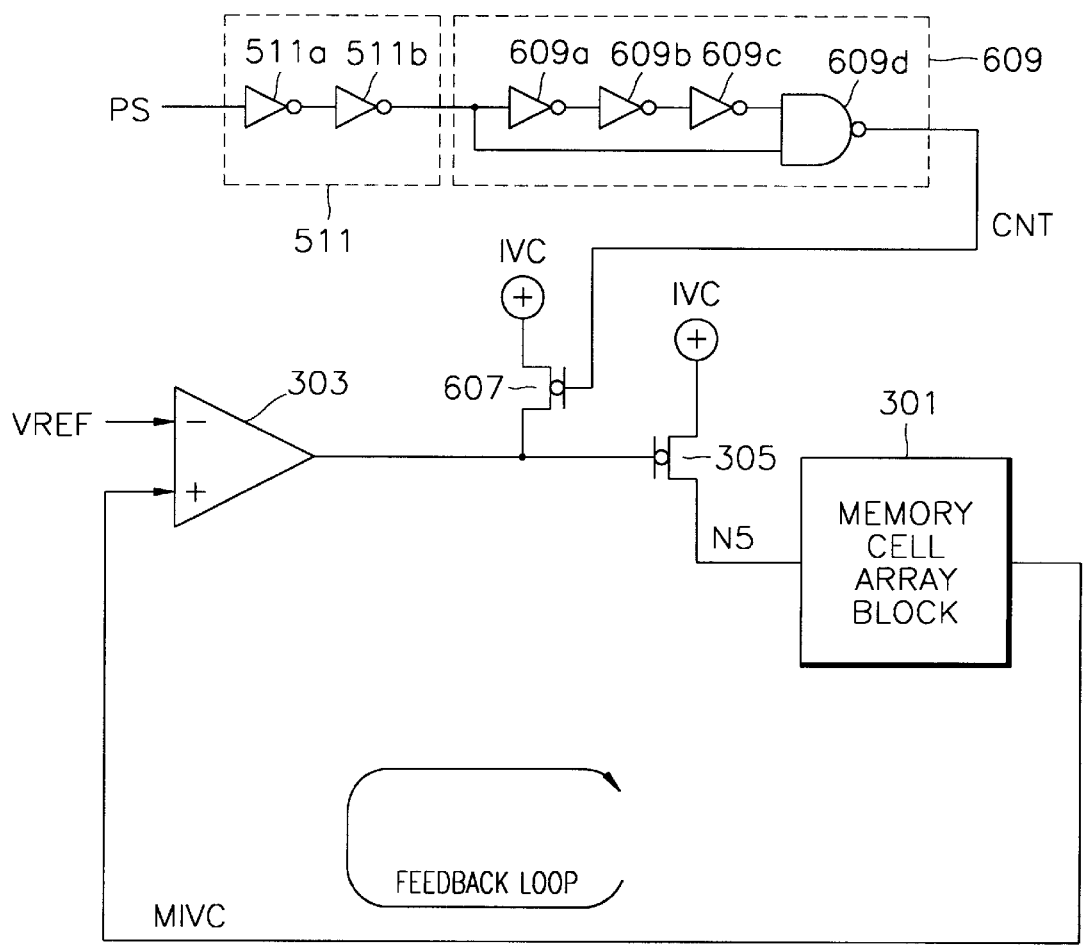
FIG. 6 is a schematic circuit diagram showing a semiconductor memory device according to a fourth embodiment of the present invention.

FIG. 6 is a schematic circuit diagram of a semiconductor memory device according to a fourth embodiment of the present invention.

Referring to FIG. 6, the semiconductor memory device according to the fourth embodiment of the present invention includes a memory cell array block 301, a differential amplifier 303 using a reference voltage VREF and an internal supply voltage MIVC fed back from the memory cell array block 301 as inputs, an internal supply voltage driver 305 for supplying an internal supply voltage IVC to the memory cell array block 301 in response to the output of the differential amplifier 303, pull up means 607 for pulling up the output port of the differential amplifier 303 in response to the control signal CNT, control signal generating means 609 for generating the control signal CNT, and the delay means 511 for delaying the input signal PS for a predetermined time and outputting the delayed input signal PS to the control signal generating means 609.

The memory cell array block 301, the differential amplifier 303, and the internal supply voltage driver 305 are the same as those shown in FIG. 3. The delay means 511 is the same as that shown in FIG. 5.

The pull up means 607 is constituted of a PMOS transistor, in which the internal supply voltage IVC is connected to a source, the control signal CNT is connected to a gate, and the output of the differential amplifier 303 is connected to a drain.

The control signal generating means 609, which is an automatic pulse generator, includes a first inverter 609a for receiving the output signal of the delay means 511 and inverting the received output signal, a second inverter 609b for inverting the output of the first inverter, a third inverter 609c for inverting the output of the second inverter, and a NAND gate 609d for generating the control signal CNT, using the output of the third inverter and the output of the delay means 511 as inputs. Here, the first through third inverters 609a through 609c are delay elements and the inversion delay circuit is constituted of the odd-numbered inverters.

To be more specific, the input signal PS is transited from the logic $^2$low$^2$ level to the logic $^2$high$^2$ level at the point of time where the internal supply voltage is used by the memory cell array block 301 during the sensing operation. Accordingly, the control signal CNT having a predetermined negative pulse is generated by the control signal generating means 609. Accordingly, the pull up means 607 is turned on for a time corresponding to the width of the negative pulse and the output of the differential amplifier 303 is pulled up for a predetermined time. Therefore, the internal supply voltage driver 305 is compulsorily turned off for the predetermined time after the delay time of the delay means 511 from the point of time where the internal supply voltage is used during the sensing operation. Accordingly, it is possible to prevent the overshooting of the output node N5.

In the semiconductor memory device according to the present invention, it is possible to prevent the dip phenomenon and the overshooting phenomenon from occurring in the output of the internal supply voltage driver. Namely, in a semiconductor memory device according to the present invention, the output of the internal supply voltage driver is stable.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor memory device, comprising:
   a memory cell array block;
   a differential amplifier adapted to receive a reference voltage and an internal supply voltage fed back from the memory cell array block at input ports;
   an internal supply voltage driver adapted to supply an internal supply voltage to the memory cell array block in response to a signal output from the differential amplifier;
   a pull down circuit adapted to pull down an output port of the differential amplifier to a ground voltage in response to a control signal having a predetermined pulse; and
   a control signal generating circuit adapted to generate the control signal in response to an input signal transited during a sensing operation of the memory cell array block.

2. The semiconductor memory device of claim 1 wherein the internal supply voltage driver comprises a PMOS transistor having a source, a drain, and a gate, the internal supply voltage being connected to the source, the output port of the differential amplifier being connected to the gate, and the drain being connected to the memory cell array block.

3. The semiconductor memory device of claim 1 wherein the pull down circuit comprises an NMOS transistor having a source, a drain, and a gate, the output port being connected to the drain, the control signal being connected to the gate, and a ground voltage being connected to the source.

4. The semiconductor memory device of claim 1 wherein the control signal generating circuit comprises:
   an inversion delay circuit adapted to delay the input signal for a predetermined time;
   a NAND gate adapted to receive the delayed input signal and the input signal as inputs; and
   an inverter adapted to generate the control signal by inverting an output of the NAND gate.

5. The semiconductor memory device of claim 1 wherein the pull down circuit comprises:
   a first NMOS transistor having a first source, a first drain, and a first gate, the output port being connected to the first drain and the control signal being connected to the first gate; and
   a second NMOS transistor having a second source, a second drain, and a second gate, the first source being connected to the second drain and the second source being connected to the ground voltage and the second gate.

6. The semiconductor memory device of claim 1 wherein the pull down circuit comprises:
   an NMOS transistor having a source, a drain, and a gate, the output port being connected to the drain and the control signal being connected to the gate; and
   a resistor having one end connected to the source of the NMOS transistor and the other end connected to the ground voltage.

7. The semiconductor memory device of claim 1 comprising a delay circuit adapted to delay the input signal for a predetermined time and output the delayed input signal to the control signal generating circuit.

8. A semiconductor memory device, comprising:
- a memory cell array block;
- a differential amplifier adapted to receive a reference voltage and an internal supply voltage fed back from the memory cell array block at input ports;
- an internal supply voltage driver adapted to supply an internal supply voltage to the memory cell array block in response to a signal output from the differential amplifier;
- a pull up circuit adapted to pull up an output port of the differential amplifier to an internal supply voltage in response to a control signal having a predetermined pulse;
- a delay circuit adapted to delay an input signal transited during the sensing operation of the memory cell array block for a predetermined time; and
- a control signal generating circuit adapted to generate the control signal in response to the delayed input signal.

9. The semiconductor memory device of claim 8 wherein the internal supply voltage driver comprises a PMOS transistor having a source, a drain, and a gate, the internal supply voltage being connected to the source, the output port being connected to the gate, and the drain being connected to the memory cell array block.

10. The semiconductor memory device of claim 8 wherein the pull up circuit comprises a PMOS transistor having a source, a drain, and a gate, the internal supply voltage being connected to the source, the control signal being connected to the gate, and the output port being connected to the drain.

11. The semiconductor memory device of claim 8 wherein the control signal generating circuit comprises:
- an inversion delay circuit adapted to receive the delayed input signal and inversion delaying the delayed input signal for a predetermined time; and
- a NAND gate adapted to generate the control signal using a signal output from the inversion delay circuit and the delayed input signal.

* * * * *